(12) United States Patent
Alphonse

(10) Patent No.: US 8,269,977 B2
(45) Date of Patent: Sep. 18, 2012

(54) DISCRETE SPECTRUM BROADBAND OPTICAL SOURCE

(76) Inventor: Gerard A Alphonse, Princeton, NJ (US)

( * ) Notice: Subject to any disclaimer, the term of this patent is extended or adjusted under 35 U.S.C. 154(b) by 0 days.

(21) Appl. No.: 13/111,047

(22) Filed: May 19, 2011

(65) Prior Publication Data

US 2011/0292399 A1 Dec. 1, 2011

Related U.S. Application Data

(60) Provisional application No. 61/396,284, filed on May 26, 2010.

(51) Int. Cl.
*G01B 9/02* (2006.01)
*H01S 3/00* (2006.01)
*H01S 3/08* (2006.01)

(52) U.S. Cl. .............. 356/479; 359/346; 372/92

(58) Field of Classification Search ........... 356/479, 356/497; 359/341.3, 344, 346; 372/6, 44.01, 372/92
See application file for complete search history.

(56) References Cited

U.S. PATENT DOCUMENTS

| | | | |
|---|---|---|---|
| 4,821,277 A | 4/1989 | Alphonse et al. | |
| 5,184,247 A * | 2/1993 | Schimpe | 359/344 |
| 6,184,542 B1 | 2/2001 | Alphonse | |
| 6,424,762 B1 | 7/2002 | Lauzon et al. | |
| 6,879,610 B2 * | 4/2005 | Alphonse et al. | 372/49.01 |
| 6,937,780 B2 | 8/2005 | Alphonse | |
| 7,068,905 B2 * | 6/2006 | Vakhshoori et al. | 385/129 |
| 7,103,081 B2 * | 9/2006 | Nomaguchi | 372/49.01 |
| 7,391,520 B2 | 6/2008 | Zhou et al. | |
| 7,557,931 B2 | 7/2009 | Toida | |
| 7,697,145 B2 | 4/2010 | Izatt | |
| 7,826,059 B2 | 11/2010 | Roth et al. | |
| 7,848,791 B2 | 12/2010 | Schmitt et al. | |
| 7,872,761 B2 | 1/2011 | Pedro et al. | |
| 2009/0213882 A1 * | 8/2009 | Weida et al. | 372/23 |
| 2009/0262359 A1 | 10/2009 | Bajraszewski et al. | |

OTHER PUBLICATIONS

De Boer, J.F., et al., "Improved signal-to-noise ratio in spectral-domain compared with time-domain optical coherence tomography", Optics Letters, 2003, pp. 2067-2069, 28-21, p. 2067-9, Optical Society of America, USA.
Leitgab, R.C., Hitzenberger, C.K. and Fercher, A.F., "Performance of Fourier domain vs. time domain optical coherence tomography", pp. 889-894, Optics Express, 2003. 11 (8 ), Optical Society of America.
Alphonse, G.A. Gilbert, D.B., Harvey, M.G. and Ettenberg, M., "High-Power Superluminescent Diodes", IEEE Journal of Quantum Electronics, pp. 2454-2457, 24, 1988, IEEE, USA.

(Continued)

*Primary Examiner* — Michael A Lyons
(74) *Attorney, Agent, or Firm* — Sonali Banerjee

(57) ABSTRACT

A new broadband source having a discrete set of spectral emission lines having high peak power in each line is provided by placing a gain medium in a reflective cavity comprising reflective front and back surfaces. A cavity feedback factor less than unity is achieved by providing reflectivity of one surface substantially lower than the reflectivity of the other surface such that spontaneous emission in the gain medium is linearly amplified just below the lasing threshold. In an alternative arrangement, a movable external back surface placed at a prescribed distance from the gain medium provides a means to achieve a free spectral range and finesse of the emission lines to match a pitch of a detector array in a SD-OCT system. By simultaneously providing high power to each detector element of the array, sensitivity and imaging speed of SD-OCT system are significantly improved.

24 Claims, 7 Drawing Sheets

OTHER PUBLICATIONS

Henry, C.H., "Theory of Spontaneous Emission Noise in Open Resonators and its Application to Lasers and Optical Amplifiers", IEEE Journal of Lightwave Technology, pp. 288-297, LT-4, 1986, IEEE, USA.

Alphonse, G.A., "Design of High-Power Superluminescent Diodes with Low Spectral Modulation", Proceedings of SPIE, pp. 125-138, vol. 4648, 2000, SPIE USA.

Vasallo, C., "Polarization-independent antireflection coataings for semiconductor optical amplifiers", Electronic Letters, pp. 61-62, vol. 24, 1988, IEEE, USA.

Alphonse, G.A. and Toda, M., "Mode Coupling in Angled Facet Semiconductor Optical Amplifiers and Superluminescent Diodes", IEEE Journal of Lightwave Technology, pp. 215-219, 10, 1992, IEEE, USA.

* cited by examiner

Figure 1 - Prior Art

DISCRETE SPECTRUM BROADBAND OPTICAL SOURCE

CROSS REFERENCE TO RELATED APPLICATION

This application claims priority from the U.S. Provisional Patent Application No. 61/396,284 filed on May 26, 2010 under the provision of 35 U.S.C. §119(e).

BACKGROUND OF THE INVENTION

1. Field of the Invention

This invention is related to the field of Optical Coherence Tomography (OCT) imaging systems and in particular to a light source with an optical spectrum exhibiting a discrete set of narrow peaks having high optical power, to be used with OCT imaging systems.

2. Description of the Related Arts

Optical Coherence Tomography (OCT) is a fast and accurate optical imaging technique frequently used in producing high-resolution diagnostic images for a variety of diagnostics and clinical applications. Currently, most common commercial application of OCT is primarily in the field of ophthalmology. Emerging applications include but are not limited to, field of cardiology, dentistry, cancer diagnosis, glucose monitoring, and dermatology to name a few. As the technology matures and becomes cost effective, applications of OCT may be expanded to other fields in future.

Primarily, OCT is an interferometric technique in which, the light from a broadband or a tunable source is split into a reference arm and a sensing arm of an interferometer. Light from the two arms are made to interfere and the interferometric signal detected by a detector is processed in time domain or frequency domain, to obtain an image of a sample-for example, a retina or a fundus in ophthalmological diagnostics. An important condition to detect an interference signal is that the optical path difference between the two arms of the interferometer is shorter than the coherence length of the light source.

In principle, OCT can be configured to operate in a "time domain" (TD-OCT) imaging mode or in a Fourier-domain (FD-OCT) imaging mode. In a TD-OCT system, length of a reference arm is linearly scanned to match depth locations in a test sample placed in a scanning arm to obtain a depth profile features of the sample. While the method is accurate, limitations of a conventional TD-OCT system is well documented in the U.S. Pat. No. 7,697,145 issued to Izatt on Apr. 13, 2010 which is being incorporated by reference in its entirety. Some of the limitations are, complexity and relatively low speed of mechanical scanning devices, single detector that serially obtains signal to build a sample image pixel by pixel, and low source output power resulting in a need for signal integration at the detector that results in low imaging speed.

On the other hand, the FD-OCT system offers about 100 times more sensitivity and about 50-100 times faster image acquisition speed. Two equivalent FD-OCT configurations are currently being considered particularly for medical applications—a Swept Source (SS)-OCT configuration (SS-system hereinafter) and a Spectral Domain (SD)-OCT configuration (SD-system hereinafter). With the same average source power, the performances of the SS-system and SD-system are identical regarding data acquisition rate and return loss. However, there are differences in systems cost, complexity, and speed capability.

In a SS-system, the wavelength of a single broadband tunable source is sequentially scanned to produce a depth profile of the sample in the frequency domain. A single detector sequentially detects the light and produces an interference signal. The interference signal is the cross-product of the light reflected from the reference and sensing arms and it is produced by the detector which is a square law device. The speed of imaging is limited by the scanning speed of the tunable laser. In addition, the swept source is complex and bulky. Only complicated experimental systems have been shown to reach the 10-15 KHz claimed speed. Most commercial SS-systems operate at a slower rate. In a swept source OCT system disclosed in the U.S. Pat. No. 7,697,145 issued to Izatt on Apr. 13, 2010, a tunable narrow band source whose frequency is swept with time, is used to image a sample using phase sensitive multi-channel detection system to improve the imaging speed.

In the U.S. Pat. No. 7,391,520 issued to Zhou et al. on Jun. 24, 2008, an alternative FD-OCT system is disclosed where a multi-wavelength laser is used as a light source. The advantage of this system is that the sweeping range of each individual laser is substantially reduced as compared to a single wavelength laser to cover the same spectral range. A multi-channel receiver detects the interferometric signal thereby increasing the speed of each axial scan. The disclosure of the U.S. Pat. No. 7,391,520 is hereby incorporated by reference in its entirety.

The alternative to the SS-system is a SD-system that has two potential advantages in terms of speed as has been disclosed in several U.S. Pat. No. 7,557,931 issued to Toida on Jul. 7, 2009, U.S. Pat. No. 7,826,059 issued to Roth et al. on Nov. 10, 2010, U.S. Pat. No. 7,848,791 issued to Schmitt et al. on Dec. 7, 2010 and U.S. Pat. No. 7,872,761 issued to Pedro et al. on Jan. 18, 2011, each one being incorporated by reference in their entirety.

A common feature of systems described in these patents is that a broadband light source such as a Super Luminescent Diode (SLD) or an Amplified Spontaneous Emission (ASE) light source is used. Since the interference signal in a SD-system is generated using light from a broadband source a dispersive device such as a grating is necessary to separate the interfering light (the combined reference and sensing lights) into its spectral components. Each spectral component can then be detected simultaneously using a photo-detector array to produce the interference signal. The detector array can be read out at a much faster rate and signal from the detector can be processed simultaneously or sequentially, to produce an image at a faster rate than in a SS-system.

However, since currently available SLD and ASE sources exhibit low power density, power per pixel received at the detector is comparatively low which may result in lower sensitivity. In order to achieve higher sensitivity, a longer signal integration time is required at the detector array thereby, limiting the speed of imaging. Imaging speed for the SD-system can be improved by increasing the signal at the detector elements so as to reduce integration time at the detector. Therefore SD-system although more affordable, may require a trade-off between sensitivity and speed.

A preferred source for the SD-system would be the one in which the light source has more input power such that the interfering signal reaches the detector with more power. An alternative light source having a discrete spectrum of high-power spikes may be a more desirable option in improving the OSNR (Optical Signal to Noise Ratio) at the detector and allow higher imaging speed than SS-OCT. More importantly, if the discrete spectrum of the source matches the spatial distribution of the detector array elements, high accuracy images may be obtained in a shorter time.

In the United States Patent Application Publication No. 2009/0262359 by Bajraszewski et al. on Oct. 22, 2009, a comb generator is disclosed where light from a source traverses through an adjustable Fabry-Perot device to generate multiple peaks. One mirror of the adjustable Fabry-Perot device is mounted on a positioning device to control positions of the spectral components of the optical frequency comb such that elements of a detector array may be aligned with the peaks of the optical frequency comb.

SUMMARY OF THE INVENTION

In one embodiment a discrete spectrum broadband light source is configured using a broadband optical gain medium placed within a reflector cavity. The reflector cavity is constructed with a very low reflectivity front reflective surface and a high reflectivity back reflective surface such that the cavity gain is adjusted to operate in a linear amplifier mode without reaching a lasing threshold at any wavelength. Output spectrum of the broadband source comprises amplified emission lines having high peak power in each emission line resembling teeth of a comb ('COMB' source).

In other embodiment of the invention the gain medium includes a waveguide structure where the end facets of the waveguide function as reflective surfaces of a reflector cavity. In a preferred configuration at least one end of the waveguide is placed at an angle with respect to the corresponding end facet so as to reduce the reflectivity at the surface. A tilted or a curved waveguide gain medium is preferred such that reflectivity at one of the end facet may be reduced to a desired low level. In addition, anti-reflective coatings may be used.

In a different embodiment a discrete spectrum broadband light source is configured from a basic semiconductor optical amplifier (SOA) or a SLD structure comprising a 'single-pass' semiconductor optical amplifier, placed within a reflector cavity to provide controlled front and back feedback. The controlled amount of feedback increases the effective gain sufficiently thereby, emitting amplified spontaneous emission (ASE) spectrum of the semiconductor. The overall spectrum of the broadband light source at low resolution resembles optical spectrum of a SLD. Around the center of the broad spectrum high resolution spectrum of the broadband light source exhibits a discrete set of individual emission lines having high output peak power in each emission line. High resolution spectral profile resembles teeth of a comb ('COMB' source).

In an alternative embodiment a discrete spectrum broadband light source is configured by enclosing a gain medium in a reflector cavity where at least one reflective surface of the reflective cavity is integral to the gain medium and a second reflective surface is external to the gain medium. The gain medium comprises a waveguide structure for example a travelling wave semiconductor optical amplifier. The waveguide structure includes but is not limited to, a curved waveguide or a tilted waveguide where at least one end of the waveguide is at an angle with respect to the corresponding end facet. The spectrum of the gain medium is modified to include high peak power multiple emission lines resembling teeth of a comb.

In other embodiment of the invention a broad spectrum of a SLD may be modified by placing the SLD in a reflector cavity. The SLD functions as a gain medium within the reflector cavity comprising at least two reflective surfaces out of which at least one reflective surface is integral to the gain medium, and the second reflective surface is external to the gain medium. The spectral profile of the broad spectrum of the SLD is modified to include high peak power multiple emission lines resembling teeth of a comb. The distance between the two reflective surfaces may be adjusted such that the spatial distribution of each emission line in the spectral profile is made to match the spatial distribution of detectors in a detector array for simultaneous detection of all the spectral components received from a test sample to be imaged.

A new SD-system is provided where input light is provided using a broadband source characterized by a spectral profile comprising a discrete set of individual spectral components such as multiple emission lines having high output peak power. In order to improve the detection sensitivity further, the spatial distribution of the spectral components is designed to match the spatial resolution of detectors in a detector array (detector array pitch) so as to provide high input optical power at each detector simultaneously. Signal from each detector could be read simultaneously or sequentially, at a rate faster than the scanning speed of a tunable laser (typically used in a SS-OCT), thereby achieving higher imaging speed.

The discrete spectrum broadband light source employed in the new SD-system may be configured by placing a gain medium within a reflector cavity. Advantageously, the reflector cavity may be configured of at least one or preferably both the reflective surfaces integral to the gain medium. Alternatively, the reflector cavity may be configured of at least one reflective surface that is external to the gain medium.

BRIEF DESCRIPTION OF THE DRAWING

The presently claimed invention will be understood and appreciated more fully from the following detailed description, taken in conjunction with the drawing figures in which:

DETAIL DESCRIPTION

Figure 1:
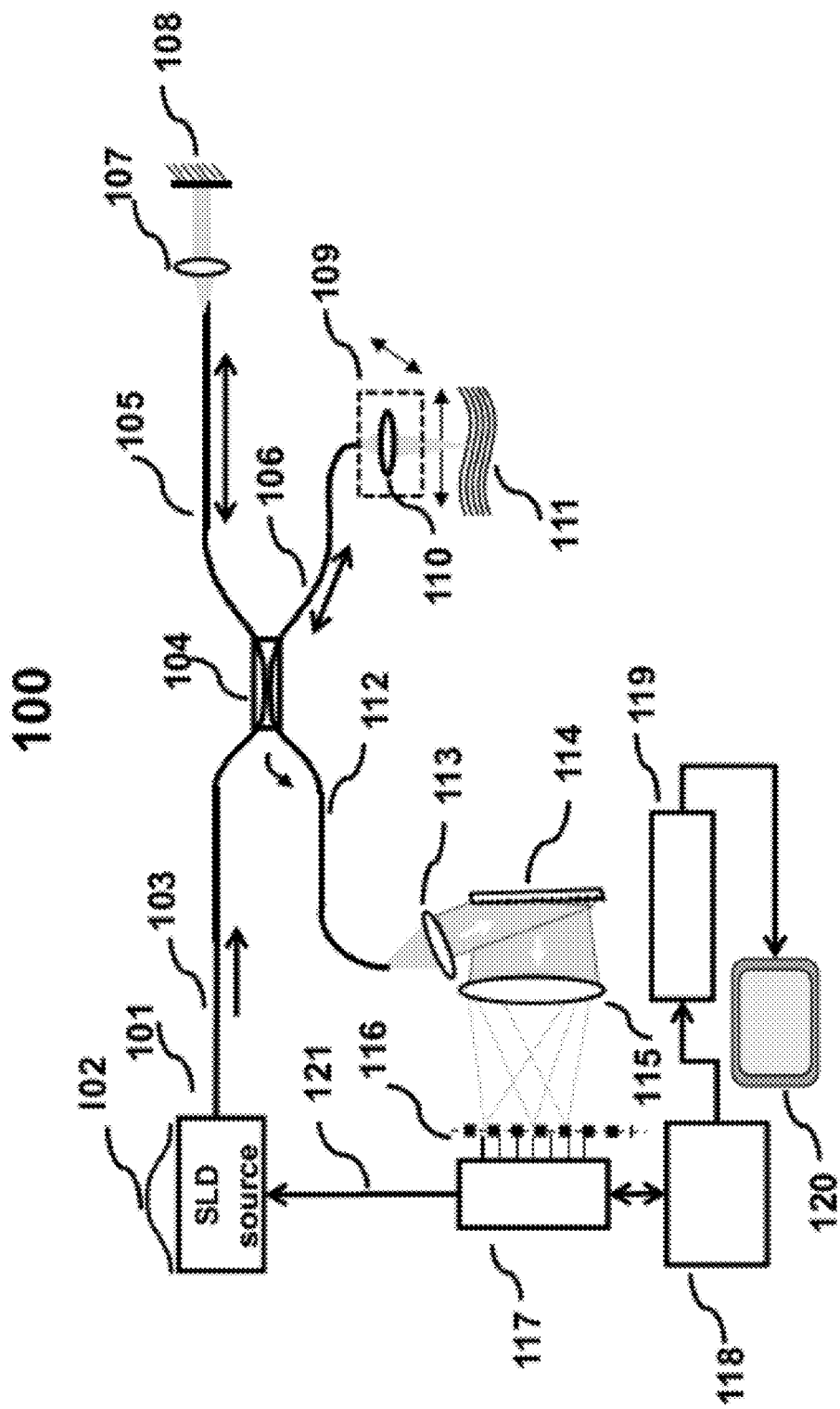
FIG. 1 is a schematic representation of a prior art Spectral Domain (SD)-OCT system.

For clarity and ease of discussion, each drawing figure shows a particular aspect or a combination of few aspects that may be implemented in an embodiment either alone or, in combination with one or more different aspects shown in other embodiments of the invention. Different aspects described in various embodiments may be combined without deviating from the principles of the invention. It is not be construed that an element not shown in any embodiment is precluded from the features shown in that drawing figure unless stated otherwise. Like elements in each drawing figure are represented by similar reference numerals wherever possible (for example reference numeral 201 in FIG. 2 represents an element that is identical or performs equivalent function, referred as 101 in FIG. 1) for ease of understanding, and to avoid repeated explanation.

Figure 2:
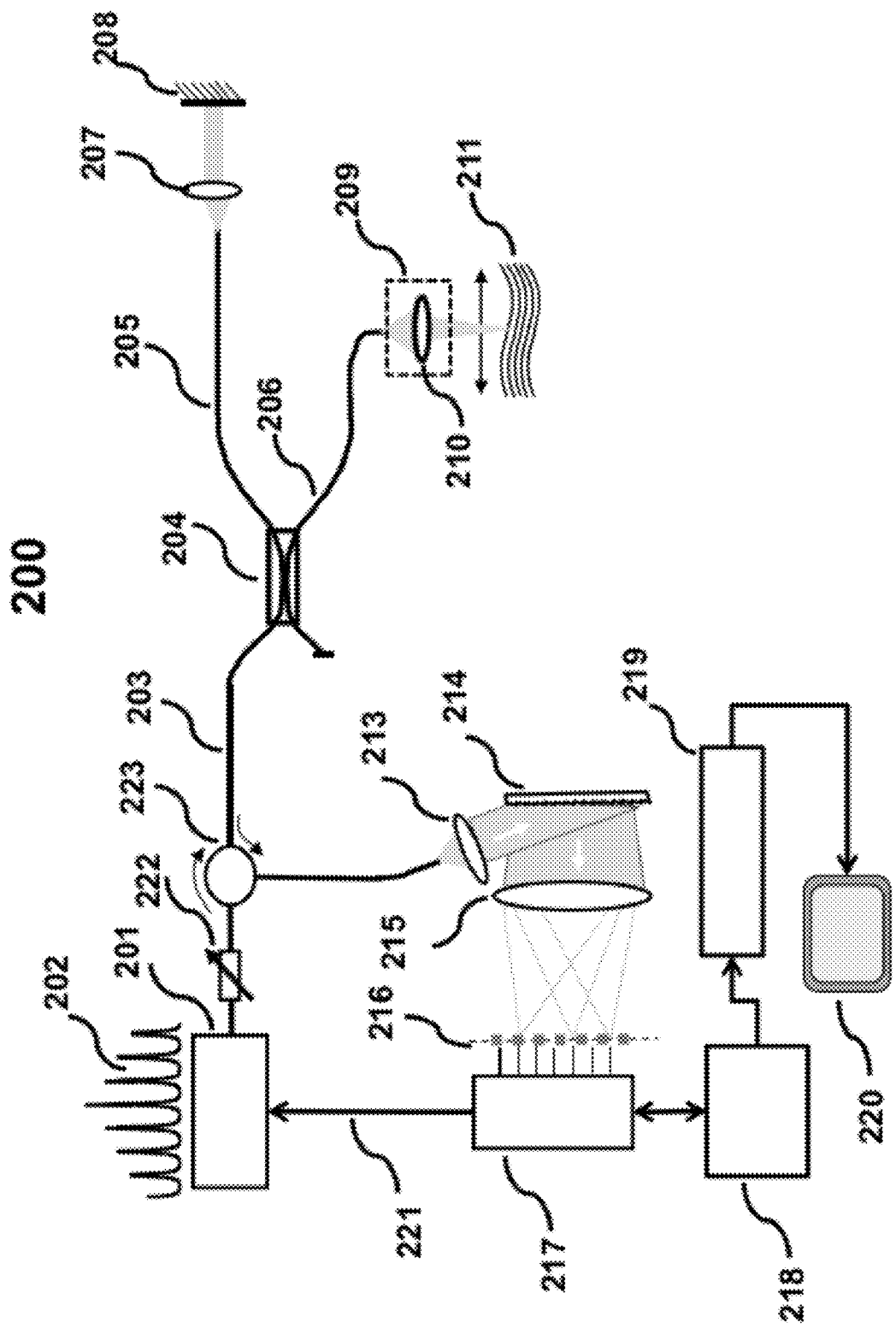
FIG. 2 is a schematic representation of a Spectral Domain (SD)-OCT system configured according to the present invention.

Referring now to FIG. 1, there is shown a schematic representation of a prior art SD-OCT system 100 currently used in many medical imaging applications. Single and double headed arrows shown next to optical paths or optical components, respectively indicate direction of light transmission or translation of the optical component as the case may be. The directions shown here are exemplary and are not to be construed as limiting. The prior art system 100 shown in FIG. 1 utilizes a SLD 101 as a source having a broad optical spectrum 102. Input light 103 from the SLD is split in a splitter/combiner 104 and directed along a reference arm (reference path) 105 and a sensing arm 106 (sensing/imaging path), respectively, of an interferometer. The splitting ratio may be selected according to the requirement-for example, in most medical applications the sensing arm receives a very small fraction of the input light. A collimating optics 107 directs the light in the reference arm to a reflective device 108.

A scanner 109 capable of translation in two-dimensions (shown by the double headed arrows) is placed in the sensing arm where a focusing optics 110 focuses the light onto a sample 111 to obtain image from different areas of the sample. Profiling along the depth of the sample is achieved by sampling at different wavelength components. Reflected light traversing the round trip path from the reference and the sensing arms combine in the splitter/combiner. The combined light 112 is collimated by a collimating optics 113 and directed to a dispersion device 114 for example, a diffraction grating.

The grating disperses the combined light into different wavelength components that are focused by a focusing optics 115 onto detector elements of a detector array 116. The detector elements detect interference signal generated from the combined light. A selector switch 117 directs the interference signal detected by the detector array through a Fast Fourier Transform (FFT) device 118 to a signal processor 119 and finally, the image is displayed on a display device 120. The selector switch also provides a trigger signal 121 to control the imaging cycle.

It is important to note that the SLD used as a light source typically used in the prior art system is a 'single pass' semiconductor optical amplifier (SOA) that outputs an amplified spontaneous emission (ASE) spectrum of the semiconductor. Since gain in a SOA is exponential with the drive current, very high drive current of a few hundred miliampere (mA) is needed to obtain high output power. There is a practical limit to applying high driving current due to cooling requirements, stable operation and gain saturation that gives rise to spectral distortion. Maximum output power that can be derived from a SLD used in the prior art SD-OCT system is limited mainly by thermal considerations thereby, limiting sensitivity of the prior art SD-OTC system. Sensitivity may be improved by integrating the detector signal but integrating detector signal limits the rate of imaging.

Sensitivity of the prior art SD-OCT system described earlier may be improved significantly by using a discrete spectrum broadband optical source designed according to the present invention. A SD-OCT system using a discrete spectrum source is schematically shown in FIG. 2. The SD-OCT system 200 shown in FIG. 2 resembles the prior art system in many ways. Therefore similar reference numerals are used for components that are equivalent or exhibit equivalent functionality to avoid repeated explanation.

The SD-OCT system as shown in FIG. 2 is different from the SD-OCT system shown in FIG. 1 in that it utilizes a new discrete spectrum broadband optical source 201 (to be described later) that exhibits a discrete set of emission lines or a 'COMB' like optical spectrum 202. Light output from the source passing through an optional variable attenuator 222 is coupled to the interferometer via a circulator 223 to isolate the input light from the returning light. A splitter/combiner 204 divides the input light 203 into two optical paths of an interferometer, a reference path 205 and a sensing path 206, respectively. It is noted that the optical path as implied in the following description includes but is not limited to, free space optical path, an optical fiber, different waveguide structures constructed in any semiconductor or dielectric medium including integrated optics platform, silicon optical bench, etc. that are well known and well documented in the art and will not be described further.

In the sensing path, focusing optics 210 focuses the light onto a sample 211 placed on a scanner 209 that can be translated in two-dimensional physical space. Different variations of focusing optics and methods of placing and scanning the sample will be apparent to those skilled in the art. The light traversing the round trip path from the reference and the sensing paths combine in the splitter/combiner and the combined light 212 is collimated by a collimating optics 213 and directed to a dispersion device 214. The dispersion device generates different wavelength components that are focused by a focusing optics 215 onto elements of a detector array 216. The combined light generates an interference signal in the detector which detects the interference signal according to square law detection.

A selector switch 217 directs the signal detected by the detector array for further processing. The processing devices include but are not limited to, a Fast Fourier Transform (FFT) device 218 and a signal processor 219 generates an image of the sample. The sample image is displayed on a display device 220. The selector switch also provides a trigger signal 221 to control the imaging cycle. Other processing means, processing sequence and display devices well known in the art, may occur to those skilled in the art and are well within the realm of this invention.

As mentioned earlier, one of the applications of OCT is in medical diagnostics. Therefore it is important that optical power of light going to the sensing path be within a permissible limit to prevent tissue damage. At the same time it is necessary to maintain the high signal at the detector array for better sensitivity and speed of imaging. In the exemplary configuration a variable attenuator (222) preferably with a power level monitor (not shown here) is used to control the total light input to the splitter/combiner (204). It is preferable to use an asymmetric splitter transmitting more light to the reference path than to the sensing path such that the light input to the sensing path is maintained within the permissible limit.

Since the interference signal is proportional to the product of the reflected reference and sensing lights, the asymmetrical power splitting ratio allows the system to retain the advantages of keeping the overall power high at the detector while maintaining the optical power reaching the sample and in particular, to biological samples within the permissible limit. In the embodiment shown in FIG. 2, the combined reflected light from the reference path and the sensing path is directed through the splitter/combiner in the direction opposite to the input light. The circulator (223) directs the combined light to a different path thereby isolating it from the input light.

The new discrete spectrum broadband light source shown in FIG. 2 is an important aspect that distinguishes this invention from its prior art counterpart. The prior art light source for example a SLD, does not incorporate a gain mechanism that would increase the output power. The new light source according to this invention is configured by placing a gain medium in a reflector cavity with a controlled amount of front and back reflection to provide a desired amount of feedback gain in the gain medium. The gain medium for the discrete spectrum light source includes but is not limited to, a SLD, an ASE source, an optically pumped Erbium Doped (ED) fiber, a solid state laser, or any other low coherence broadband light source.

The effective gain (also called feedback gain) of the gain medium enclosed in the reflector cavity (to be described later in detail) increases considerably compared to the gain without feedback. The output spectrum of the new light source shown in FIG. 2 at low resolution exhibits a broad envelope very similar to optical spectrum of a SLD. However, at high resolution the spectrum of the new source exhibits a set of discrete emission lines (spikes), having large peak power in each emission line (spike). The optical spectrum having multiple high power laser-like emission lines resembles teeth of a comb. Hence the new discrete spectrum source disclosed herein is named 'COMB' source. Advantageously, the power output of the new source is at least an order of magnitude higher than a SLD of comparable length.

The new broadband source operates on principles similar to that of a Fabry-Perot (FP) resonator and will be described in reference with FIG. 3. A schematic of a FP resonator is shown in the view 300A and a schematic of the new broadband source is shown in view 300B, respectively. Referring now to the view 300A, a FP resonator 301 comprises a resonant reflector cavity of length 'L' including an optical material having a refractive index 'n'. Two parallel faces of the cavity are coated with partial reflectors 303 and 304 having reflectivity $R_1$ and $R_2$, respectively. The reflective surfaces 303 and 304 will be referred as the back and front reflective surfaces, respectively, with the front reflective surface being an output end where light from the light source is output. These are mere conventions that are adopted for the ease of discussion and are not to be construed as limiting.

Incident light 305 entering the cavity from the left surface for example, undergoes multiple reflections inside the cavity and a portion of it is transmitted outside the cavity as the output light 306. The direction of input and output light are only exemplary and are not to be construed to be the only options. The transmission function T of the output light is given by—

$$T = \frac{(1 - \sqrt{R_1 R_2})^2}{1 + R_1 R_2 - 2\sqrt{R_1 R_2} \cos\left(\frac{4\pi n L}{\lambda}\right)}, \quad (1)$$

where $\sqrt{R_1 R_2}$ is always < 1

The quantity $\sqrt{R_1 R_2}$ (also written as $(R_1 R_2)^{1/2}$ for convenience)), which is the resonator's effective reflectivity, is also called the feedback factor. As the cosine function varies between +1 and −1, the feedback factor modulates the transmission function and exhibits periodic intensity variations as a function of wavelength. Discrete intensity maxima and minima in the transmission spectrum resemble teeth of a comb. The transmission maxima would be unity in a loss less dielectric medium and less than unity in a dielectric medium having loss. In other words, the transmission peak would never be higher than the intensity of the input light. The width of the discrete spectral lines is determined by values of $R_1$ and $R_2$.

Referring now to the view 300B, there it shows a schematic of an exemplary source configured according to the present invention. In this example a direct comparison with the FP resonator is used to illustrate the principles of operation of the new discrete spectrum broadband source. In particular, in this configuration a cavity of length 'L' is constructed of two reflective surfaces 303 and 304, respectively. Convention for input and output end will be followed according to the description presented earlier in reference with the schematic representation 300A of the FP resonator. The reflective surfaces include but are not limited to, polished metal surface, cleaved or polished semiconductor surface, coated mirrors, thin film coatings including single or multiple layer metal coatings, dielectric coatings, etc. Different types of reflective surfaces are well known in the art and will not be described further.

Unlike the FP resonator, the reflective cavity in the new source does not receive an external input light. Instead, light is generated internally in a gain medium 310 placed within the reflective cavity. In an exemplary configuration the gain medium may be a travelling wave SOA where spontaneous emission light $P_{sp}$ is generated within the cavity by recombination of electrons and holes upon injecting an electric current. The central wavelength and the width of the optical spectrum are determined by the bandgap energy.

Without any external input, the spontaneous emission light $P_{sp}$ is amplified by the exponential gain $G_s$ as it traverses between the reflective surfaces. As the spontaneous emission undergoes multiple internal reflections just as in the FP resonator, it picks up additional gain at each pass. The resulting output light $P_{COMB}$ is given in terms of the SLD output $P_{SLD}$:

$$P_{COMB} = P_{SLD}\left[\frac{(1 - R_2)(1 + R_1 G_s)}{1 + K^2 - 2K\cos\left(\frac{4\pi n_e L}{\lambda}\right)}\right] \quad (2)$$

where $$P_{SLD} = P_{sp}(G_s - 1), K = G_s\sqrt{R_1 R_2}, \text{ and } G_s = \exp(g_0 I - \alpha L) \quad (3)$$

with the requirement that $$K = G_s\sqrt{R_1 R_2} = G_s(R_1 R_2)^{1/2} < 1 \quad (4)$$

In Eqs. (2)-(4), $R_1$ and $R_2$ are the reflectivity of the reflective surfaces 303 and 304, respectively and $n_e$ is the effective refractive index of the gain medium. In the expression for $G_s$, $g_0$ is the gain coefficient, I the drive current, and $\alpha$ the attenuation coefficient.

In the new source the light generated within the cavity traverses between the reflective surfaces multiple times and as a result is amplified. A small fraction of the amplified light exits the cavity as the output light 306. Eq. (2) is the expression for power for the light output at the reflective surface 304 that is shown to be coupled to an optical fiber pig tail 307 in this exemplary configuration. The optical spectrum 302 of the output light comprises a discrete set of emission lines having high peak power in each emission line. The overall output power of the new source is significantly larger than the output power of the SLD source described earlier in reference with FIG. 1.

The strong periodic modulation and gain enhancement of the new source results from the quantity in the brackets in Eq. (2). It is noted that the denominator has exactly the same form as for the FP resonator, except for the resonator feedback factor is replaced by a new feedback factor that includes not only the reflectivity $R_1$ and $R_2$ of the cavity reflective surfaces but also the single pass gain $G_s$ of the gain medium.

Feedback gain can be quite large even for very small values of $R_1$ and $R_2$ due to the gain in the gain medium. As long as K (Eq. 4) remains less than unity, the device continues to function as a feedback amplifier for the spontaneous emission. In the expression for K (Eq. 4), the inverse of the effective reflectivity $(R_1 R_2)^{-1/2}$ may be defined as a limiting gain $G_L$ which can be used as a design parameter that should never be exceeded. In terms of the limiting gain $K=G_s/G_L$, and the condition $G_s=G_L$, defines onset of lasing in the gain medium.

It is evident that lower is the effective reflectivity, higher is the $G_L$ and higher is the maximum allowable value of $G_s$, which translates into higher output power capability of the discrete spectrum source. It is extremely important to prevent the feedback gain from becoming infinite at any particular wavelength, in which case the device would function as a laser, focusing all its output power in a very narrow band around that particular wavelength. If the feedback factor is kept below laser threshold, or the single-pass gain below the limiting gain $G_L$, the device remains a high-gain FP amplifier for the spontaneous emission without ever becoming a laser. This changes the smooth SLD spectrum into a discrete set of high-power narrow emission lines at the center of the broad spectrum.

It may be noted that in Eq. (2), the condition $R_1 \sim R_2 \sim 0$, $K \sim 0$ corresponds to power output from a SLD source. The cavity does not provide any feedback regardless of the value of the gain. The quantity in the brackets in Eq. (2) becomes unity and the output power is $P_{sp}(G_s-1)$, the standard expression for the SLD output. For a well designed SLD, $R_1$ and $R_2$ are of the order of $10^{-6}$, respectively, and $G_s$ is of the order of $10^4$, and with $P_{sp} \sim 0.002$ mW, the SLD output power is about 20 mW. The value of K is then 0.01, and the SLD exhibits a small spectral modulation m, given by—

$$m = \frac{P_{max} - P_{min}}{P_{max} + P_{min}} = \frac{2K}{1+K^2} \text{ or about 2\%} \quad (5)$$

At the other extreme, for a semiconductor laser, $R_1 \sim 0.1$ to 0.9 and $R_2 \sim 0.1$, and lasing threshold is reached for $G_s = 3.3$ to 10.

The expression in the bracket in Eq. 2 represents the feedback gain profile for the discrete spectrum source, and the power at the emission peaks is given by $$P_{COMB} = P_{SLD} \frac{(R_1 G_s + 1)}{(1-K)^2} \quad (6)$$

with the conditions:

$$K = \frac{G_s}{G_L},$$

$G_s < G_L$, $G_L = (R_1 R_2)^{-1/2}$ and $R_2 \ll R_1$.

The value of the discrete spectrum source output power is relatively higher than the output power of a SLD of a comparable length and made from the same gain medium. As an example, choosing $R_2 = 10^{-5}$, and $R_1 = 0.1$ in Eq. 6, gives $G_L = 1000$. Then choosing $G_s = 500$ yields $K = 0.5$ and $P_{COMB} = 200 P_{SLD}$. This example illustrates the fact that the discrete spectrum source has considerably more output power. In addition, the power in the discrete spectrum source is concentrated in the peaks of emission lines which can be made to coincide with the detector array pitch (or the spatial distribution of detector elements in a detector array for example, in an OCT-system). Consequently, using a discrete spectrum source would enhance sensitivity of detection significantly as compared to a prior art SLD source.

Referring back to FIG. 3 and in particular to the view 300B and Eq. 2 simultaneously, it may be well appreciated that the feedback provided by the reflector cavity can be quite large even for very small values of $R_1$ and $R_2$ due to high gain in the medium. Therefore it is extremely important to prevent the feedback gain from becoming infinite at any particular wavelength, to avoid laser operation in a very narrow band around that particular wavelength. As long as the feedback factor $K=G_s/G_L$ is less than unity, the device remains a high-gain amplifier without ever becoming a laser.

The configuration in view 300B, while suitable to discuss the comparison of the discrete spectrum source with the FP cavity and understanding the principles of design of the new broadband source, does not lend itself to satisfying the criterion K<1 at high gain for all combinations of $R_1$ and $R_2$, because $R_2$ cannot be made low enough to allow useful cavity gain for any value of $R_1$, particularly when the waveguide is perpendicular to the corresponding end facets. In this configuration, the practical limit of $R_2$ is about $10^{-4}$, thus requiring $G_s$ to be less than 100 even if $R_1$ is close to 100%.

Figure 3:
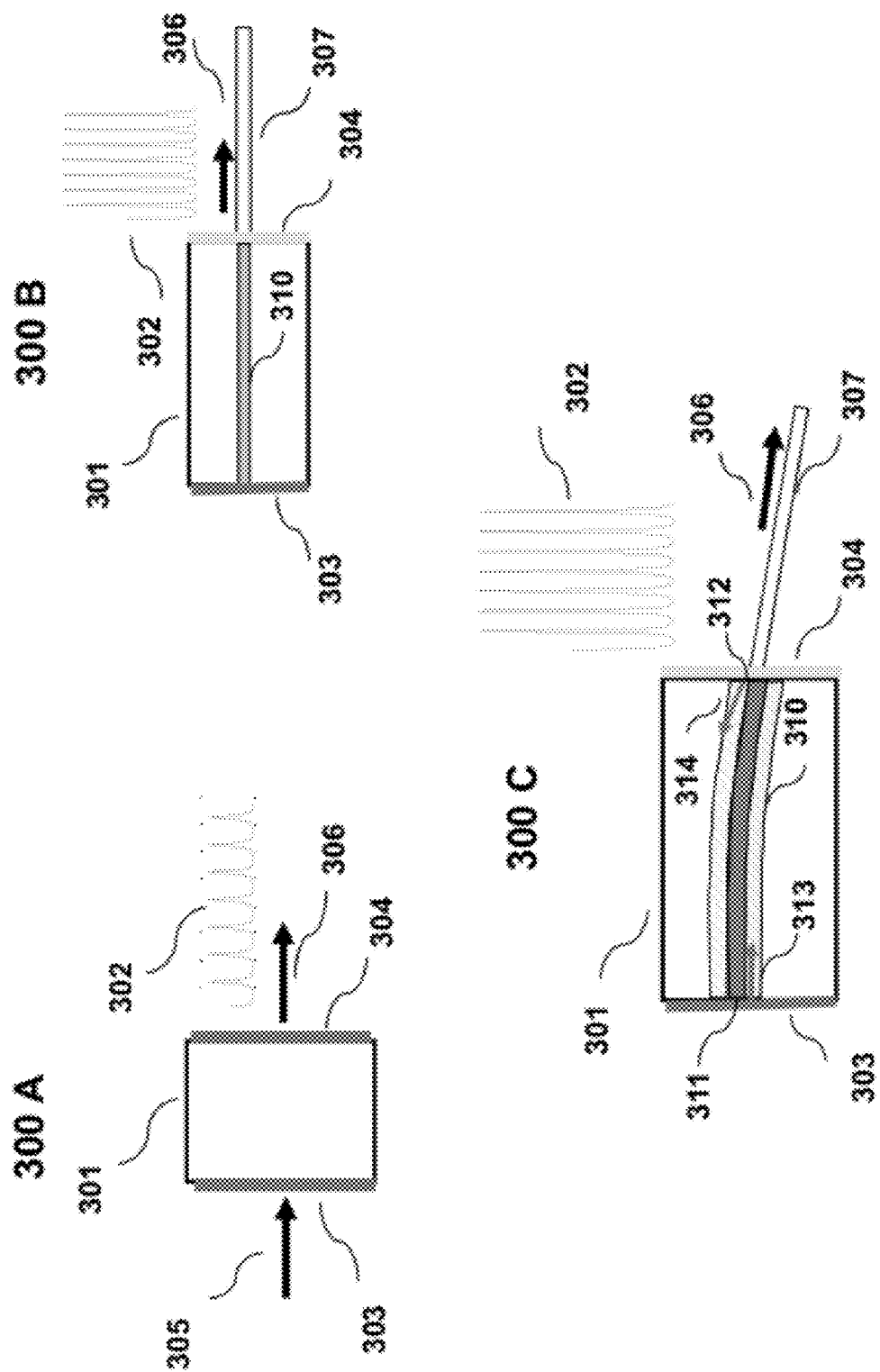
FIG. 3 represents a schematic view comparing design of a Fabry-Perot (FP) Resonator and design principles of a discrete spectrum light source of the present invention.

A preferred configuration 300C shown in FIG. 3 is similar to the configuration 300B except that the waveguide structure in the gain medium 310 is a 'curved' waveguide. A device having such a structure is described in the U.S. Pat. No. 6,937,780, issued to the applicant of this application on Aug. 30, 2005, and is being incorporated by reference in its entirety. More specifically, one end preferably the front end 312 of the waveguide is at an angle with the reflective surface 304 whereas the other end preferably the back end 311 of the waveguide is substantially perpendicular to the reflective surface 303, respectively. In this configuration reflectivity at the front end of the waveguide can be made smaller as compared to the reflectivity at the back end of the waveguide. In particular, not all the light reflecting off of the front end is directed into the waveguide (grey bold arrow 314) whereas almost all the light reflected off of the back end is redirected into the waveguide (grey bold arrow 313). Additional antireflection coatings may be necessary to achieve a reflectivity lower than $10^{-4}$ at the front end.

Figure 4:
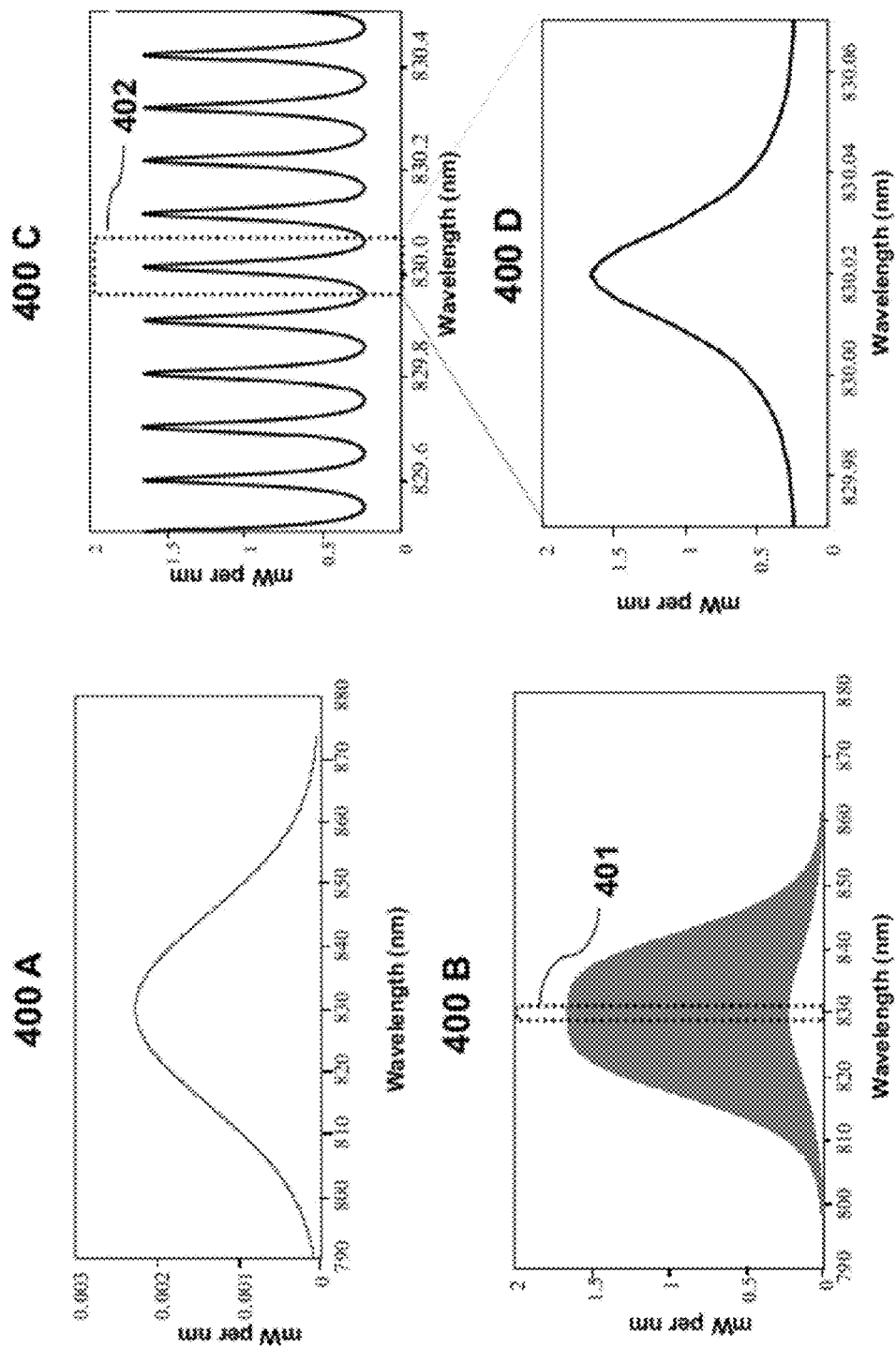
FIG. 4 represents optical spectra of an exemplary discrete spectrum light source as compared to a spectrum of a Super Luminescent Diode (SLD)

Simulation results for an exemplary spectral density calculation are shown in FIG. 4 for a structure with length L=1 mm, effective refractive index $n_e=3.4$, and SOA bandwidth $\Delta\lambda=50$ nm together with an optical spectra of a SLD (400A) of similar dimension for comparison. In all the spectra shown in this figure the x-axis represent wavelength (in nm) and the y-axis represents optical power (in mW/nm). More specifically, calculated optical spectrum of the new broadband source and several expanded views of the center of the spectrum are shown in views 400B, 400C and 400D, respectively.

In the full spectrum plot 400B of the new broadband source, the individual lines are not discernible because of their sheer number and close spacing. The central portion of the spectrum 401 shown enlarged in 400C, exhibits the comb "teeth" as a group of narrow individual lines at the cavity resonance peaks with a spacing $\delta\lambda$ between them. A further expansion of $\delta\lambda$ around a single line 402, shown in 400D, depicts an individual tooth as a Gaussian-like and laser-like spectral line of narrower Full Width at Half Maximum (FWHM) $\Omega$. The spacing $\delta\lambda$ is usually referred to as the Free Spectral Range (FSR), and the width $\Omega$ is referred to as the linewidth of these laser-like spectral lines. It is important to note that the peak power in each emission line is significantly higher than the output power of the SLD alone (400A).

The resonance peaks occur at values of the wavelength that make the cavity length L equal to an integer multiple of half-wavelength (L=m$\lambda$/2, where m is a positive integer). The FSR is thus the wavelength spacing between two consecutive values of m. From this and the value of K, the line spacing $\delta\lambda$, linewidth $\Omega$, and the Finesse F (a measure of how narrow the linewidth is with respect to the FSR) are written as:

$$FSR \ \delta\lambda = \frac{\lambda_c^2}{2n_eL} \ \ \text{Linewidth} \ \Omega = \frac{1-K}{\pi\sqrt{K}} FSR \quad (7)$$

$$\text{Finesse} \ F = \frac{\pi\sqrt{K}}{1-K} \ \ \text{Number of lines} \ N = \frac{\Delta\lambda}{\delta\lambda} \quad (8)$$

In the sample calculation, $\delta\lambda$=2.53 Angstroms, $\Omega$=0.25 Angstroms (a finesse of 10), N=198 lines or comb teeth.

Figure 5:
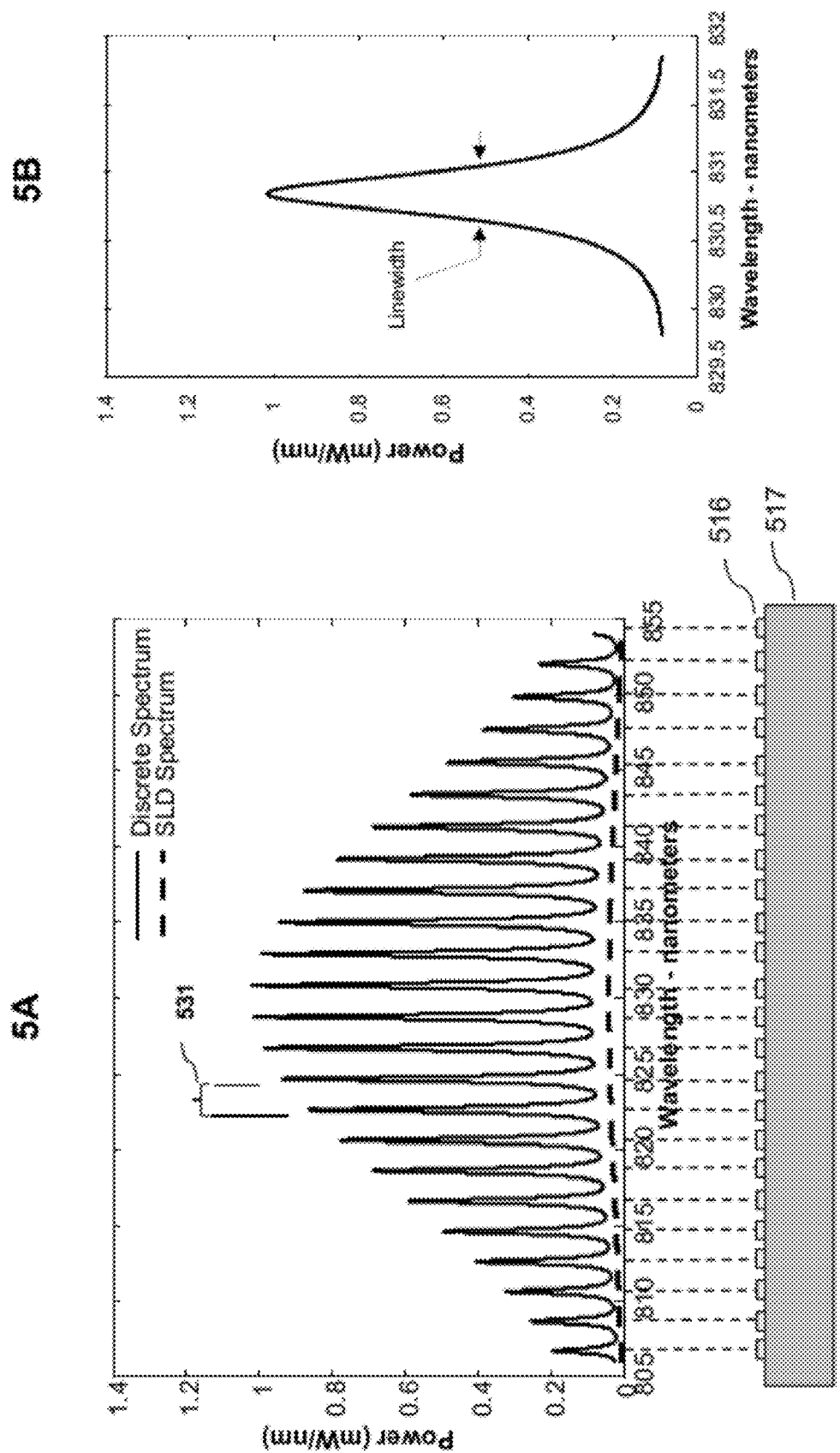
FIG. 5 is schematic representation of spectra obtained from a discrete spectrum light source with controllable line spacing to match the detector elements of an array detector.

One important aspect of the new source is that the reflector cavity may be designed to obtain a predetermined FSR and finesse such that the discrete spectral components may be optionally adjusted to match the spatial distribution of the detector elements of the detector array as has been shown in FIG. 5. Referring now to FIG. 5, and in particular to the view 5A, there it shows optical power output (y-axis) as a function of wavelength (x-axis) for a discrete spectrum source constructed from a SLD-like SOA (solid line) as compared to the optical spectrum of the SLD itself (broken line).

The discrete spectrum source exhibits Gaussian-like spectral lines (solid curve)—of which an expanded version of a single line is shown in the view 5B. The Gaussian-like spectral lines are separated by FSR (531) such that, the distribution of the spectral lines matches the spatial distribution of the elements of the detector array 516. More importantly, the peak power incident on a detector element from the discrete spectrum source is significantly higher than the power incident from the SLD (dashed curve). As a result detection sensitivity and therefore imaging speed is enhanced considerably.

In SD-OCT and SS-OCT systems, the axial range or the depth in the sample that can be probed without changing the length of the reference path (which is supposed to be fixed) is given by 0.44$\lambda^2$/$\Omega$, where $\Omega$ is the linewidth of the individual light peaks. The axial resolution or the minimum detectable separation between two points along the probing depth in a sample is given by the coherence length $l_c$ of the light source, which is written as, $l_c$=0.44$\lambda^2$/$\Delta 2$, where $\Delta\lambda$, is the bandwidth of the broadband source. Accordingly the broader is the bandwidth ($\Delta\lambda$) the shorter the coherence length and the higher the resolution.

For the new source, the axial range according to the exemplary simulation would be 23 mm and the resolution would be 14.9 microns. In ophthalmology the axial range of interest is of the order of a 2-3 mm. The fact that the axial range shown here is about 10 times longer than the retinal nerve thickness demonstrates why it is not necessary to scan the reference path. Such a long axial range is not necessary for biological studies, but any linewidth can be obtained by the choice of gain and feedback reflection.

For the ease of discussion and to demonstrate the principle of operation of the broadband light source in the exemplary embodiment described earlier, it was assumed that the broadband source was created by using a SOA with a waveguide having perpendicular end facets similar to a laser structure. In practice, a waveguide having perpendicular end facets similar to that used in a laser structure is not very efficient to make a good discrete spectrum broadband source.

In order to make a discrete spectrum broadband source out of a laser structure, $R_1$ will be forced to a very low value in order to keep K<1 when the gain in the medium is high. Furthermore, low $R_1$ values make inefficient devices due to large power loss in transmission through the back facet. Furthermore, $\delta\lambda$ is fixed by the semiconductor chip length and therefore cannot be modified to match the pitch of a detector array for example a detector array typically used in a SD-OCT system. A broadband source with an adjustable length cavity and the capability for very low values of $R_2$, of the order of $10^{-6}$ or less would be more practical and useful.

Figure 6:
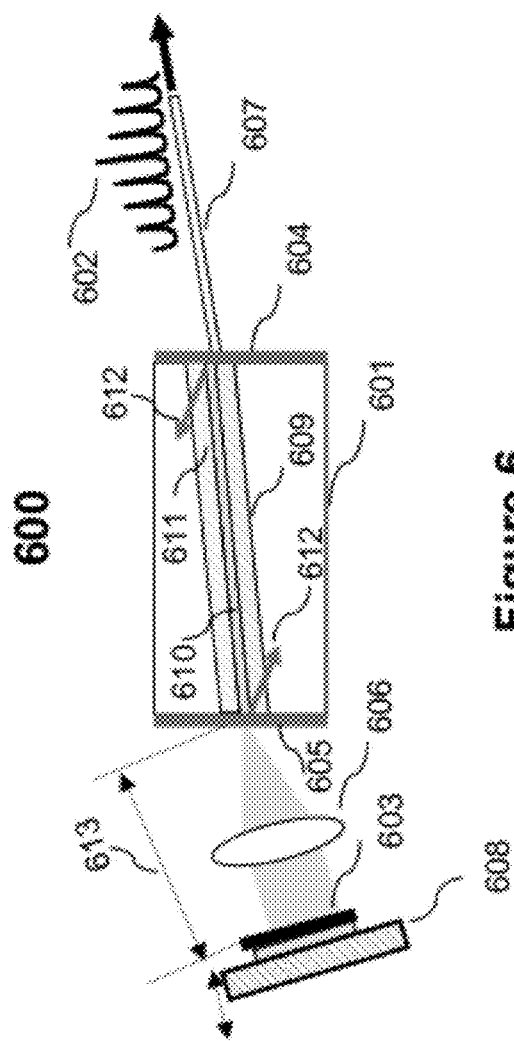
FIG. 6 is a schematic representation of a discrete spectrum light source configured using a tilted waveguide Super Luminescent Diode (SLD)

For a more efficient discrete spectrum broadband source a different alternative design is proposed. Referring now to FIG. 6, there it shows a preferred embodiment 600 of the broadband light source that exemplifies an adjustable length reflector cavity with K<1 and it is more practical to implement. More specifically, 601 is a semiconductor chip similar to a SOA or a SLD. For stable operation, the chip is mounted on a temperature stabilizing device such as a thermoelectric cooling device (not shown here). The chip comprises a waveguide structure 609 including a core region 610 having a refractive index $n_1$, and a cladding region 611 having a refractive index $n_2$, where $\Delta n = n_1 - n_2$, and $\Delta n > 0$.

The waveguide is bounded on two parallel ends by low reflectivity front and back reflective surfaces 604 and 605, respectively, to avoid forming a reflector cavity of length 'L' and to enable the gain medium to function strictly as an optical amplifier with negligible feedback. Such feedback, if not made negligible, would cause spurious lines to appear in the spectrum at different wavelengths than those intended for the discrete spectrum. Upon injecting an electric current (typically a few 100 mA), light generated by spontaneous emission is amplified substantially in a single pass. The entire structure including the low reflectivity surfaces and the waveguide forms an optical amplifier. Low reflectivity surfaces on both ends of the gain medium are to ensure that gain medium functions strictly as an optical amplifier without spurious lines.

To achieve low reflectivity at the end facets, the waveguide is tilted with respect to the facets at both ends such that most of the reflected light is directed away from the waveguide (indicated by the bold grey arrows 612). A device having such a structure is described in the U.S. Pat. No. 4,821,277, issued to Alphonse et al., on Apr. 11, 1989, of which the applicant of this application is a coauthor, is being incorporated by reference in its entirety. The net reflection is not completely eliminated because diffraction causes a small amount of light to still be captured by the waveguide, this amount being determined by the tilt angle and the lateral refractive index difference between the core and the cladding materials of the waveguide structure. In this exemplary embodiment, as a design choice the front and back end facet (604 and 605) reflectivities $R_2$ and $R_3$, respectively, may be comparable as long as they are both in a range $10^{-4}$-$10^{-6}$ or lower. However, it is always preferable to keep $R_3 < R_2$ so as to apply a controlled amount of feedback for all gain values. Additionally an antireflection (AR) coating is used on one or both the reflective surfaces to reduce the reflectivity further. The output spectral profile of such a source is the broad amplified spontaneous emission light as obtained in a SOA or a SLD essentially with no or negligible spurious modes resulting from the combined effect of $R_2$ and $R_3$.

Referring simultaneously to FIGS. 3 and 6, a discrete spectrum source is configured by placing the gain medium just described in reference with FIG. 6, in an external reflective cavity formed with a back reflective surface for example, a mirror 603 having a reflectivity $R_1$ and the reflective surface 604 integral to the gain medium as the front reflective surface having a reflectivity $R_2$, respectively. It is further noted that the reflective surface 603 is external to the gain medium. It is recalled from the earlier discussion that the feedback factor K<1 where, $K=G_s\sqrt{R_1R_2}$ (Eq. 4). It is also recalled that K must be <1 for all values of $R_1$. It is noted that for the external reflective surface 603 values of $R_1$~100% are acceptable provided, $R_2 < \sim 10^{-6}$.

The back reflective surface 603 is mounted on a translation device 608 to introduce a variable distance between the reflective surfaces 603 and 604. Thus, the cavity length may be adjusted. The advantages of the variable distance will be discussed shortly. An optical element 606 is disposed for directing the light between the low reflectivity surface 605 of the gain medium and the back reflective surface 603 of the external cavity, respectively, such that the incident light on the reflective surface 603 is collimated so it can be refocused onto the gain medium regardless of the travel distance of the translation stage. The translation can be accomplished by any convenient means for rapid electrical setting or manual setting. It was earlier described that $R_2$ is in a range $10^{-4}$-$10^{-6}$. Therefore, $R_1$ need not be very low to keep K less than unity. In fact, even if $R_1$ is nearly 100%, K is still less than unity for $G_s$<1000. The entire combination, namely the gain medium in the external cavity, still functions as a high gain feedback amplifier without reaching a lasing threshold.

Output light having a discrete spectrum 602, exiting from the reflective surface 604 is coupled to an output fiber 607. The discrete spectrum exhibits multiple emission lines having high peak-power. The FSR of the discrete source spectrum is now modified as—

$$FSR = \delta\lambda = \frac{\lambda_c^2}{2(n_e L + d)} \qquad (9)$$

where $L_c = n_e L + d$ is defined as the total cavity length.

In Eq. 9, $\lambda_c$ is the operating center wavelength of the broadband source, $n_e$ is the effective refractive index of the gain medium, and d is a variable distance between the semiconductor chip and the external movable mirror 603. The FSR and finesse of the output spectrum may be controllably adjusted by simply changing distance d to match the spatial distribution of the spectral elements with the detector array pitch, for example. In FIG. 6 the variable distance is shown as a length of free space and movable back mirror. Other alternatives known in the art for example, a stretching fiber length, a fixed length medium with controllable refractive index are equally effective in providing the variable distance.

An additional calibrated detector (not shown) may be placed behind the back reflective surface (603) at a small angle (to avoid undesirable reflections) for measuring a residual component of the optical signal that is transmitted through the surface 603. The additional detector signal may then be used for performance monitoring and control. The monitoring and control functions may include but are not limited to, control a drive current to operate the gain medium at a constant output power, tune the operating wavelength, control and maintain the thermoelectric cooler temperature and initiate or stop a measurement cycle to name a few. A person skilled in the art may conceive other similar monitoring and control functions that are well known in the art and are within the purview of the principles of the invention.

Figure 7:
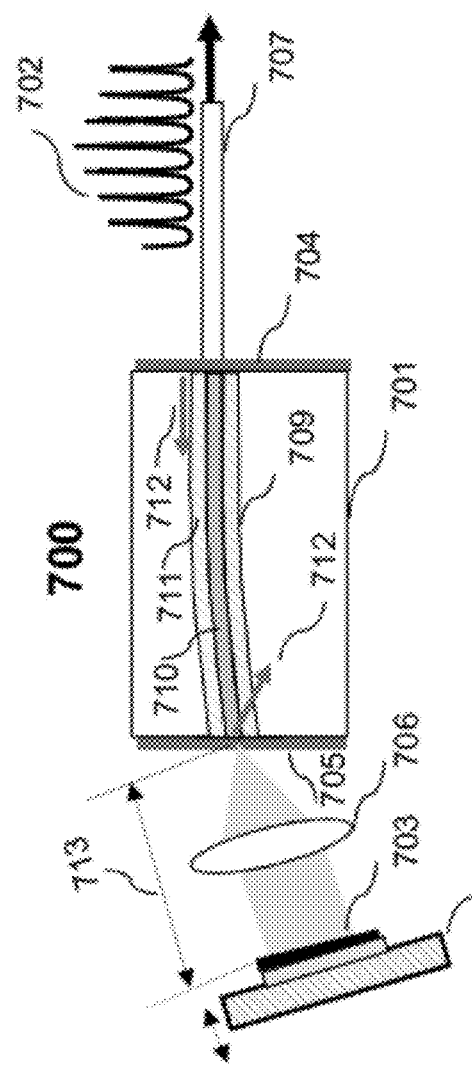
FIG. 7 is a schematic representation of a discrete spectrum light source configured using a bent waveguide Super Luminescent Diode (SLD)

Same principles are applied to configure another preferred embodiment shown in FIG. 7. More specifically the schematic representation 700 shows a discrete spectrum source similar to the one described in reference with FIG. 6. In the following description components that are equivalent or perform equivalent functions are identified with similar reference numerals to avoid repeated explanation. In this configuration a gain medium 701 comprising a semiconductor chip having a waveguide structure with a core 710 and a cladding 711 is disposed between an external reflective cavity formed between an external back reflective surface 703 and the front reflective surface 704, respectively. It is recalled that the reflective surface 704 is integral to the semiconductor chip having a reflectivity $R_2$ that is very low.

In this configuration the waveguide structure in the gain medium is a 'curved' waveguide (synonymously referred as a bent waveguide) similar to one used in a curved or bent SLD described earlier in reference with the configuration 300C in FIG. 3 except that the waveguide end is perpendicular at the front facet and the opposite back end of the waveguide is at an angle with the back facet of the gain medium. The waveguide is curved or bent towards the back facet such that the back facet has the same low reflectivity characteristics as in the gain medium described in reference with FIGS. 6 and 3.

It is important to note that in this configuration the external reflective surface 703 is the back reflector of the cavity, and the reflectivity of the external surface can approach nearly 100%. Therefore, it is possible to have the front reflective surface 704 to have a slightly higher reflectivity than 604 in FIG. 6. The light is reflected back into the waveguide at the front facet whereas the light is reflected at an angle at the back facet of the gain medium (bold grey arrows 712). The back facet is coated with antireflection (AR) coating for very low reflectivity $R_3$, of the order of about $10^{-6}$ or lower reflectivity, and the front facet is also coated with antireflection (AR) coating, but since the waveguide is perpendicular to the facet at the front, achievable front reflectivity $R_2$ can be no lower than about $10^{-4}$.

The gain medium is placed in an external reflector cavity comprising an external reflective surface 703 and the reflective surface 704 integral to the gain medium. The external reflective surface 703 is mounted on a translation device 708 for adjusting the FSR and finesse of the discrete spectrum 702 of the output light coupled to a fiber 707. It is noted that in this configuration the gain medium including the integral reflector cavity is placed differently than the stand alone configuration described in reference with configuration 300C. The overall operation is substantially similar to the operation of the discrete spectrum source described earlier in reference with FIG. 6, but maximum value of the gain $G_s$ is lower due to the somewhat higher value of $R_2$ (about $10^{-4}$ instead of $10^{-6}$).

Figure 8:
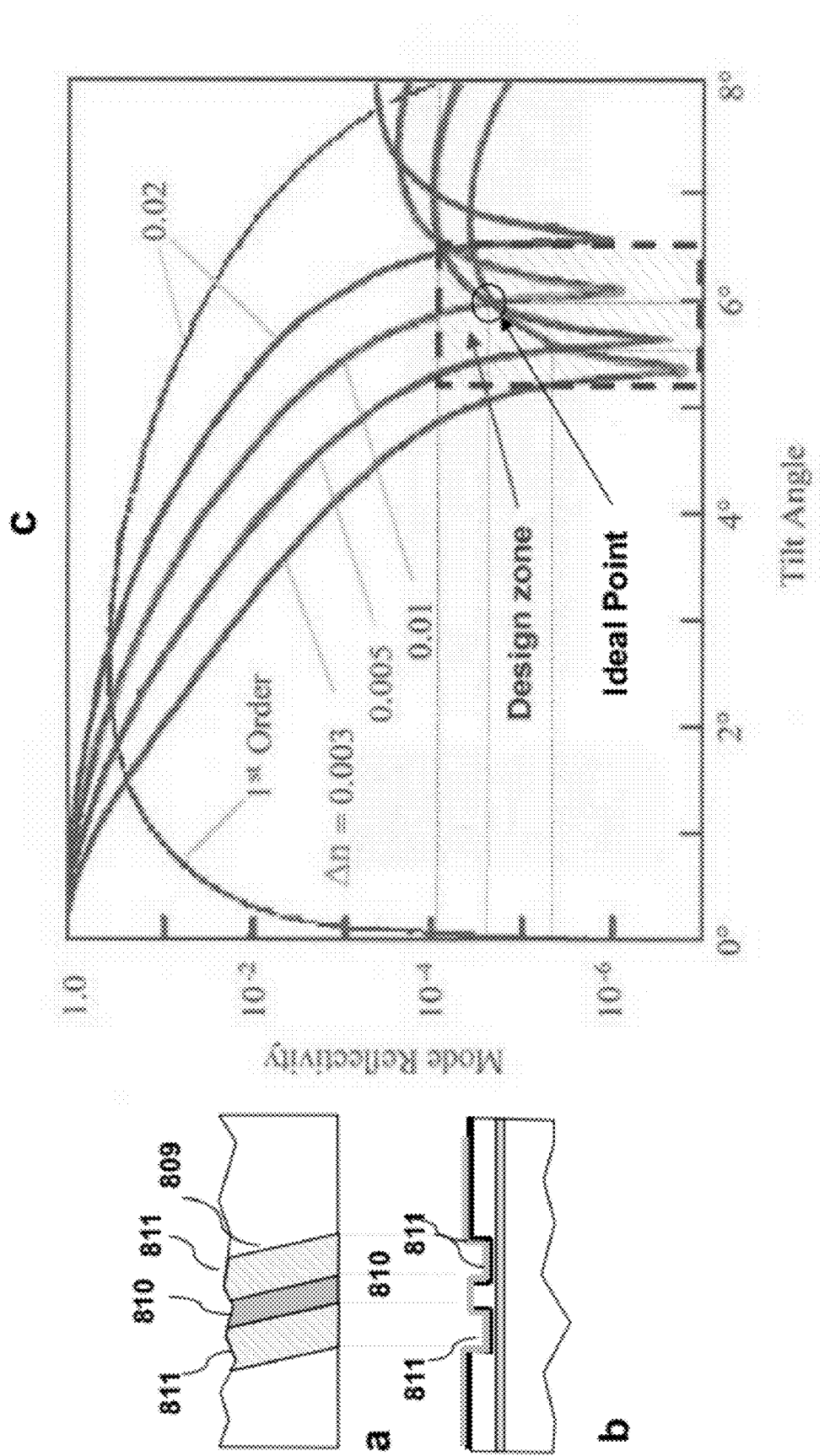
FIG. 8 is a graphic representation of principles used for designing a discrete spectrum light source according to the present invention.

The underlying design principles for obtaining low reflectivity for the discrete spectrum sources described earlier will now be outlined. Referring to FIG. 8, a top view (a) and a cross sectional cutaway view (b) of a semiconductor chip is shown together with a graph (c) of effective reflectivity of the lowest order propagation mode as a function of tilt angle (with respect to the end reflective surfaces). More specifically, the semiconductor chip comprises a tilted angle waveguide (809) including a core (810) having a refractive index $n_1$ and a surrounding cladding layer (811) having a refractive index $n_2$ where $\Delta n = n_1 - n_2$ is greater than 0. In a single mode semiconductor waveguide operating in visible and infrared regions of the spectrum the width of the core is typically 3-5 micrometer (μm) and Δn is less than 0.01 for propagation of the lowest order mode.

In the graph (c) effective reflectivity of the lowest order guided mode is plotted as a function of the tilt angle with Δn as a parameter. Depending on the design choices of Δn and of the tilt angle, a reflectivity as low as $10^{-7}$ is achievable at some specific angle. However, it is not always possible to achieve this reproducibly and reliably, due to variations in material and processing during manufacturing. Referring back to FIG. 6 earlier, it was mentioned that the reflectivity $(R_2) < \sim 10^{-4}$-$10^{-6}$ is sufficient to achieve a discrete spectrum source using an external back mirror for $R_1$. Therefore a preferred design choice would be to target a reflectivity within an acceptable range rather than a fixed low reflectivity.

Referring again to FIG. 8, a preferred zone for low reflectivity is indicated by the hatched area in the graph (c). As indicated in the plot, an optimum design, suitable for a Δn range from 0.003 to 0.01, is to choose a point of intersection of the curves for Δn=0.003, 0.005, and 0.01, the point corresponding to a tilt angle of 6° and a reflectivity of $2.5 \times 10^{-5}$. Further reduction in reflectivity is achieved by applying required anti-reflection coating(s) on one or both the end facets of the gain medium (for example, 604 and 605 in FIG. 6).

It is important to note that a well designed gain medium such as a SOA or a SLD, used in designing a discrete spectrum source described in reference with FIGS. 6 and 7 must have significantly low spectral modulation due to reflections at the front and the back facets (604 and 605 and 704 and 705, respectively). While it is preferable to have the back facet reflectivity lower than the front facet reflectivity (so that the residual light reflected from the back facet is minimal), it is often acceptable to have both facets with similar reflectivity. In an exemplary design calculation for a gain medium using the graph (c) from FIG. 8, a 4% AR coating on both the facets would reduce the reflectivity from the value of $2.5 \times 10^{-5}$ to $\sim 10^{-6}$, which is sufficient to make spurious modes from the back facet negligible.

The high peak power in spectral emission lines of the discrete spectrum source (COMB source) disclosed in this invention enable full advantage of the higher readout capability of state of the art high-speed detector arrays by minimizing the need for integration time. As a consequence, the speed of imaging for example in a SD-OCT system increases significantly. Advantageously, the discrete sampling of the detector data does not result in any data loss if the sampling frequency is higher than twice the fastest variations in the signal spectrum. In the electrical arts, this is well known as Nyquist Criterion and will not be described in detail.

Although the preferred embodiments of the invention are described in reference with a semiconductor gain medium (for example, a SOA, SLD and a ASE source), any other gain medium configured appropriately may be substituted without digressing from the principles of this invention. Such other variations and configurations would occur to those skilled in the art. For example, a fiber gain medium with angle at output end of the fiber, such as a length of super-fluorescent erbium-doped (ED) silica fiber, which fluoresces at around 1,550 nm when optically-pumped by a 980 nm laser or a 1400 nm laser, or a solid state amplifying medium may also be used.

The discrete spectrum source described in this invention utilizes inexpensive peripheral components to modify performance of devices such as SOA and SLD significantly, and in a cost effective manner. Optical power from the new source disclosed in this invention is substantially higher and confined in sharp discrete emission lines. Advantageously, the spacing between the emission lines can be adjusted to match with the pitch of the detector array thereby improving the OSNR at the detector. Consequently, sensitivity and speed of imaging is significantly improved in a OCT system using the new source. The discrete spectrum source is much more compact than the swept source used in SS-OCT systems making SD-OCT more attractive for almost all applications and thereby providing a new way of expanding the scope of application of OCT to new fields beyond the most common application in medical imaging and diagnostics.

As OCT becomes more cost effective its application may be expanded to other fields including but not limited to, identifying layered structures and coatings. For example, OCT may be applied in electronic industry in semiconductor manufacturing of integrated circuits, measurements of paint thickness in aircraft, ship and submarine manufacturing, studying fracture fatigue and stress points in equipment including military equipment, security structures and smart structures such as, buildings, bridges, ships, etc. with embedded optical fibers in their construction so that stresses or failures in those structures and their locations can be remotely monitored by interferometric methods. Other applications include but are not limited to, process manufacturing, food-quality inspection, protein identification, drug development, identification of counterfeit currency and illegal drugs, characterization of biological samples, and the use of spectral fingerprints in general to identify many types of targets.

It will be appreciated by persons skilled in the art that the present invention is not limited by what has been particularly shown and described hereinabove. Rather the scope of the present invention includes both combinations and sub combinations of various features described hereinabove as well as variations and modifications thereto which would occur to a person of skill in the art upon reading the above description and that are not in the prior art.

What is claimed is:

1. A broadband light source comprising:
   a broadband optical gain medium, said gain medium being disposed in a reflector cavity formed between a front reflective surface and an opposing back reflective surface, wherein the front reflective surface having reflectivity substantially smaller than the reflectivity of the back reflective surface is configured as an output interface of the cavity, said cavity having a feedback factor less than unity, wherein a light generated within the gain medium is linearly amplified in a controlled fashion, such that the output optical spectrum of the light source exhibits a discrete set of periodic emission lines.

2. The broadband light source as in claim 1 wherein;
   the gain medium includes a traveling wave semiconductor laser structure having a waveguide such that,
   at least one end of the waveguide is disposed at an angle with respect to the front reflective surface,
   a second opposite end of the waveguide is disposed substantially perpendicular to the back reflective surface, and
   the front and back reflective surfaces are the end facets of the waveguide structure.

3. The broadband source as in claim 2 wherein the angle between the at least one end of the waveguide and the front reflective surface is substantially between 5 and 6.5 degrees to lower the reflectivity of the front surface substantially below $10^{-4}$.

4. The broadband light source according to claim 2 wherein the semiconductor laser structure is a super luminescent diode including a curved waveguide.

5. The broadband light source as in claim 2 wherein the front and back reflective surfaces are coated with anti-reflection coating to provide a net reflectivity substantially lower than $10^{-4}$ at the front reflective surface and a reflectivity at the back reflective surface substantially higher than the reflectivity of the front reflective surface, respectively.

6. The broadband light source as in claim 1, wherein the gain medium is a length of optically-pumped super-fluorescent fiber having at least one end with an angled tip.

7. A broadband light source comprising:
a broadband gain medium including a front reflective surface and an opposing second reflective surface integral to the gain medium, wherein said front reflective surface is configured as an output interface; and
a back reflective surface, said back reflective surface having a reflectivity substantially higher than the reflectivity of the front reflective surface and positioned opposite to the front reflective surface such that a reflector cavity having a feedback factor less than unity is formed between the front and the back reflective surfaces thereby including the gain medium within the reflector cavity wherein a light generated within the gain medium is linearly amplified in a controlled fashion so as to exhibit a discrete set of periodic emission lines in the output optical spectrum of the broadband light source.

8. The broadband light source as in claim 7 wherein the gain medium is one selected from a group consisting of a semiconductor gain medium, solid state lasers, and an optically pumped super-fluorescent fiber with at least one end angled.

9. The broadband light source as in claim 8 wherein the semiconductor gain medium is one selected from a group consisting of a travelling wave semiconductor laser structure, a semiconductor optical amplifier and a super luminescent diode such that light in the semiconductor gain medium is generated by injecting an electrical current.

10. The broadband light source as in claim 8 wherein the semiconductor gain medium includes a waveguide structure having a first end proximal to the front reflective surface and a second opposite end having very low reflectivity, such that the light reflected into the waveguide at the second end is minimized and the light transmitted out of the second end is substantially coupled to the back reflecting surface.

11. The broadband light source as in claim 10 wherein the first end of the waveguide is disposed substantially perpendicular to the front reflective surface, and the second end of the waveguide is disposed at an angle with respect to a corresponding end surface, respectively.

12. The broadband light source as in claim 11 wherein said angle at the second end of the waveguide with respect to the corresponding end surface is substantially between 5 to 6.5 degrees to lower the reflectivity of the corresponding end surface substantially below $10^{-4}$.

13. The broadband light source as in claim 11 wherein the front reflective surface is coated with one or more antireflection layers to provide a net reflectivity no higher than $10^{-4}$ and the corresponding end surface at the second end of the waveguide is coated with one or more antireflection layers to provide reflectivity substantially lower than $10^{-4}$.

14. The broadband light source as in claim 11 wherein the front reflective surface is coated with one or more antireflection layers to provide a net reflectivity no higher than $10^{-4}$, and the corresponding end surface at the second end of the waveguide is coated with one or more antireflection layers to provide reflectivity in a range between $10^{-6}$-$10^{-7}$.

15. The broadband light source as in claim 10 wherein the first and the second ends of the waveguide are disposed at an angle with respect to respective end surfaces.

16. The broadband light source as in claim 15 wherein the angles between the waveguide ends and the respective end surfaces are substantially between 5 to 6.5 degrees.

17. The broadband light source as in claim 15 wherein the respective end surfaces are coated with one or more antireflection layer to provide a reflectivity substantially lower than $10^{-4}$.

18. The broadband light source as in claim 7 wherein the back reflective surface is coated to achieve close to 100% reflectivity.

19. The broadband light source as in claim 7 wherein the back reflective surface is mounted on a translation device for adjusting a variable distance between the back reflecting surface and the gain medium such that the effective length of the reflector cavity is altered to achieve a desired free spectral range of the emission lines.

20. The broadband light source as in claim 7 wherein a detector is placed behind the back reflective surface at a desired small angle so as to generate an electrical signal from the residual light transmitted through the back reflective surface such that, said electrical signal being used for monitoring and control functions.

21. An Optical Coherence Tomography system comprising:
a broadband light source, said light source further including;
a broadband optical gain medium, said gain medium being disposed in a reflector cavity formed between a front reflective surface and an opposing back reflective surface wherein, the front reflective surface having a reflectivity substantially smaller than the reflectivity of the back reflective surface is configured as an output interface, said cavity having a feedback factor less than unity, wherein a light generated within the gain medium is linearly amplified in a controlled fashion such that, the output optical spectrum of the light source exhibits a discrete set of periodic emission lines;
a variable optical attenuator, said optical attenuator to control output power of the light source, such that the feedback factor of the reflector cavity is not altered;
an interferometer including a splitter/combiner, said splitter/combiner to direct light from the light source to a reference optical path and a sensing optical path, and to combine the light reflected from the reference and sensing paths;
a dispersive device to separate different wavelength components of the combined light;
an array of detectors wherein, upon selecting a predetermined length of the gain medium the discrete set of emission lines in optical spectrum of the light source is matched to the spatial distribution of the detectors in the array; and
a signal processing device to generate an image of a test sample from an interference signal generated from the combined light at the array of detectors.

22. The Optical Coherence Tomography system as in claim 21 wherein the splitter/combiner splits the input light in an asymmetric ratio such that the input light directed in the sensing path is substantially lower than the input light directed in the reference path.

23. A high sensitivity optical coherence tomography system comprising:
a broadband light source, said light source further including;
a broadband gain medium including a front reflective surface and an opposing second reflective surface integral to the gain medium, wherein said front reflective surface functions as an output interface; and a back reflective surface, said back reflective surface having a reflectivity substantially higher than the reflectivity of the front reflective surface and positioned opposite from the front reflective surface at an adjustable distance such that a reflector cavity having a feedback factor less than unity is formed between the front and back reflective surfaces thereby including the gain medium within the reflector cavity, wherein a light generated within the gain medium is linearly amplified in a controlled fashion such that, the output optical spectrum of the light source exhibits a discrete set of periodic emission lines, a variable optical attenuator, said optical attenuator to control output power of the light source, such that the feedback factor of the reflector cavity is not altered;

an interferometer including a splitter/combiner, said splitter/combiner to direct light from the light source to a reference optical path and a sensing optical path, and to combine the light reflected from the reference and sensing paths;

a dispersive device to separate different wavelength components of the combined light;

an array of detectors wherein, upon adjusting the distance between the back reflective surface and the gain medium, the discrete set of emission lines in optical spectrum of the light source is matched to the spatial distribution of the detectors in the array; and a signal processing device to generate an image of a test sample from an interference signal generated from the combined light at the array of detectors.

24. The Optical Coherence Tomography system as in claim 23 wherein the splitter/combiner splits the input light in an asymmetric ratio such that the input light directed in the sensing path is substantially lower than the input light directed in the reference path.

\* \* \* \* \*